United States Patent
Mayer (10) Patent No.: US 9,093,353 B2
(45) Date of Patent: Jul. 28, 2015

(54) MATRIX IMAGE SENSOR PROVIDING BIDIRECTIONAL CHARGE TRANSFER WITH ASYMMETRIC GATES

(71) Applicant: E2V SEMICONDUCTORS, Saint Egreve (FR)

(72) Inventor: Frédéric Mayer, Voiron (FR)

(73) Assignee: E2V SEMICONDUCTORS, Saint Egreve (FR)

( * ) Notice: Subject to any disclaimer, the term of this patent is extended or adjusted under 35 U.S.C. 154(b) by 0 days.

(21) Appl. No.: 14/397,725

(22) PCT Filed: Apr. 11, 2013

(86) PCT No.: PCT/EP2013/057546
§ 371 (c)(1),
(2) Date: Oct. 29, 2014

(87) PCT Pub. No.: WO2013/164169
PCT Pub. Date: Nov. 7, 2013

(65) Prior Publication Data
US 2015/0123174 A1    May 7, 2015

(30) Foreign Application Priority Data
May 3, 2012  (FR) ...................................... 12 54070

(51) Int. Cl.
*H01L 27/148* (2006.01)
*H01L 27/146* (2006.01)
(Continued)

(52) U.S. Cl.
CPC ...... *H01L 27/14812* (2013.01); *H01L 27/1057* (2013.01); *H01L 27/14627* (2013.01); *H01L 27/14825* (2013.01); *H01L 29/765* (2013.01); *H01L 27/14868* (2013.01)

(58) Field of Classification Search
CPC .................... H01I 21/823406; H01I 27/1057; H01I 27/14831; H01I 27/14825; H01I 27/14868; H01I 29/765; H01I 29/76891; H01I 31/1122; H01I 31/1125
See application file for complete search history.

(56) References Cited

U.S. PATENT DOCUMENTS 6,465,820 B1   10/2002  Fox
6,633,058 B1   10/2003  O. et al.
(Continued)

FOREIGN PATENT DOCUMENTS

FR    2906080 A1    3/2008
FR    2960341 A1    11/2011
(Continued)

*Primary Examiner* — Bilkis Jahan
(74) *Attorney, Agent, or Firm* — Baker & Hostetler LLP (57) ABSTRACT

In the field of image sensors, more particularly time-delay integration linear sensors or TDI sensors, a sensor comprises rows of photodiodes alternating with rows of gates adjacent to the photodiodes. The gates are asymmetric, adjacent on one side to a photodiode and having, on the other side, narrow gate fingers extending toward another photodiode. Owing to their very narrow width, the fingers endow the transfer of charges with a directionality. Between two successive photodiodes there are two gates, the two being adjacent to the two photodiodes, the first having its narrow fingers turned toward the first photodiode, the second having its narrow fingers turned toward the second photodiode. The direction of transfer of the charges in the sensor may be chosen by neutralizing either the first gate or the second gate, the other gate receiving alternating potentials allowing the transfer of charges from one photodiode to the other.

9 Claims, 4 Drawing Sheets

(51) Int. Cl.
*H01L 27/105* (2006.01)
*H01L 29/765* (2006.01)

(56) References Cited

U.S. PATENT DOCUMENTS

| | | |
|---|---|---|
| 6,906,749 B1 | 6/2005 | Fox |
| 8,816,406 B2 * | 8/2014 | Mayer et al. ................... 257/225 |
| 2002/0097330 A1 * | 7/2002 | Spears et al. .................. 348/311 |
| 2007/0064137 A1 | 3/2007 | Kanbe |
| 2008/0217661 A1 | 9/2008 | Lauxtermann |
| 2010/0320516 A1 * | 12/2010 | Fereyre et al. ................ 257/292 |
| 2011/0303822 A1 * | 12/2011 | Mayer ........................ 250/208.1 |

FOREIGN PATENT DOCUMENTS

| | | |
|---|---|---|
| WO | 0126382 A1 | 4/2001 |
| WO | 2008034794 A1 | 3/2008 |
| WO | 2011144459 A1 | 11/2011 |

\* cited by examiner

MATRIX IMAGE SENSOR PROVIDING BIDIRECTIONAL CHARGE TRANSFER WITH ASYMMETRIC GATES

CROSS-REFERENCE TO RELATED APPLICATIONS

This application is a National Stage of International patent application PCT/EP2013/057546, filed on Apr. 11, 2013, which claims priority to foreign French patent application No. FR 1254070, filed on May 3, 2012, the disclosures of which are incorporated by reference in their entirety.

FIELD OF THE INVENTION

The invention relates to image sensors, more particularly sensors based on signal time delay and integration (or TDI sensors: Time Delay Integration linear sensors), in which an image of a line of dots of a scene being observed is reconstituted by addition of successive images taken by several photosensitive rows successively observing the same line of the scene as the scene passes progressively in front of the sensor perpendicularly to the rows.

BACKGROUND

These sensors are used for example in systems for observation of the Earth by satellite. They comprise several parallel rows of photosensitive pixels; the sequencing of the control circuits for the various rows (exposure time control then reading of the photogenerated charges) is synchronized with respect to the relative advancement of the scene and the sensor, in such a manner that all the rows of the sensor see a single line of the scene being observed. The signals generated are subsequently added together point by point for each dot of the line being observed.

The theoretical signal/noise ratio is improved by the ratio of the square root of the number N of rows of the sensor. This number can go from a few rows to a hundred or so rows depending on the application (industrial testing, Earth observation, panoramic dental X-rays or mammography).

In addition, the non-uniformities in sensitivity of the pixels of the same row bar, and the non-uniformities in dark current of the pixels, are reduced as a consequence of the averaging which results from the addition of the signals from the various rows.

In the image sensors using charge transfer (charge-coupled device or CCD sensors), the addition of the signals point by point took place naturally and without read noise by emptying into one row of pixels the charges generated and accumulated in the preceding row of pixels, in synchronism with the relative displacement of the scene and the sensor. The last row of pixels, having accumulated N times the charges generated by the image line being observed, can be read.

The standard technology of CCD image sensors uses high power supply voltages and consumes a large amount of power; this technology is based on the use of adjacent and mutually overlapping gates of polycrystalline silicon.

The technology of image sensors has subsequently evolved toward sensors with active pixels using transistors, which will hereinafter be referred to as CMOS sensors for simplicity because they are generally fabricated using CMOS (complementary-metal-oxide-semiconductor) technology; in these CMOS sensors, there is no longer any transfer of charges from row to row toward a read circuit or a register but there are active pixels with transistors that collect photogenerated electrical charges and convert them directly into a voltage or a current. The various rows of the sensor therefore successively supply voltages or currents representing the illumination received by the row. These structures do not allow summations of these currents or voltages to be performed without noise; it is therefore difficult to produce a time-delay charge integration linear sensor. The fabrication technology is however simple, it has low power consumption and it operates at low voltage.

Attempts have however been made to fabricate CMOS time-delay charge integration linear sensors.

In particular, the use of switched capacitors has been tried in which successively received currents are integrated, thus accumulating charges received from several pixels in a column onto the same capacitor (U.S. Pat. No. 6,906,749, WO0126382).

Another solution provided is to convert the signals coming from a row of pixels into digital values, to sum the digital value corresponding to the pixel of rank j of the row in an accumulator register of rank j which accumulates the digital values corresponding to the pixels of same rank j from N successive rows (patent FR2906080).

Solutions using an accumulation of charges inside of the pixel have also been provided, for example in the patent publication US2008/0217661. They use a technology more complex than that which is strictly necessary for fabricating image sensors in CMOS technology, or else they suffer from losses during the transfers of charges.

In the patent publication FR2960341, a sensor is provided using CMOS technology with a single gate level of polycrystalline silicon, using an alternation of gates and photodiodes. The structure relies on an asymmetry of the gates in order to impose a direction of transfer common to all the charges, so as to avoid the charges going off randomly in one direction or the reverse direction. Owing to this intentional asymmetry, it is excluded to be able to choose a direction for transfer of the charges in the opposite direction to the direction imposed by the asymmetry. However, in some applications, the user would like to be able to reverse the direction of accumulation of the charges. This is the case, for example, in a scanner operating in TDI mode and that needs to be able to work with both opposing directions of scanning without reversing the orientation of the sensor with respect to the image.

SUMMARY OF THE INVENTION

The aim of the invention is to provide a simple solution for producing sensors operating according to the principle of the structures using charge transfer, using a technology compatible with CMOS technology circuits, notably a technology using only a single gate level of polycrystalline silicon for the storage or charge transfer gates, and however allowing a choice of the direction of transfer of the charges.

According to the invention, an image sensor is provided using charge transfer, the sensor comprising rows of photodiodes alternating with rows of gates adjacent to the photodiodes, the gates covering an active layer region of a first type of conductivity and the photodiodes being formed in the active layer by individual regions of a second type of conductivity, themselves covered by individual superficial regions of the first type connected to a reference potential for the active layer, the gates being asymmetric, adjacent on one side to a photodiode and having, on the other side, narrow gate fingers extending toward another photodiode, the narrow fingers being separated from one another by insulating regions doped with the first type of conductivity, more doped than the superficial regions and also connected to the reference potential of the active layer, the sensor being characterized in that it comprises at least two independent gates adjacent to both a first photodiode belonging to a first row of photodiodes and to a second photodiode belonging to a second row of photodiodes, a first of the two gates having its narrow fingers extending toward the first photodiode and the second gate having its narrow fingers extending toward the second photodiode, and the two gates being controllable separately from each other.

The term "asymmetric" gate is understood to mean the fact that there is an asymmetry between the upstream side (side which receives charges) and the downstream side (side supplying charges). There may be a symmetry with respect to an axis parallel to the direction of displacement of the charges.

The fingers are sufficiently narrow for the potential of the active layer under these fingers to be influenced by the presence of the doped insulating regions on either side of the fingers, in such a manner that the potential under the fingers is locally lower than under the main body of the gate despite the fact that the same potential is applied to the fingers as to the main body of the gate.

A lower potential is understood to mean that a potential barrier is created within the active layer under the fingers with respect to the potential under the main body. This notion of potential barrier created by a lower potential makes reference to the fact that the stored charges are electrons. It will indeed be assumed for simplicity (and because it is generally so in practice) that the active layer is of the p type, that the photo-generated charges are electrons and not holes, and consequently, that a lower potential constitutes a potential barrier for the electrons with respect to a higher potential.

In the following part, it will be considered that the sensor is fabricated with an active layer of the p type, that the photodiodes store electrons in individual regions of the n type, and that the superficial regions and the doped regions which separate the narrow fingers are of the p type.

The charges present, at a given moment in time under a given gate to which a low potential is applied, cannot flow toward the photodiode situated upstream, the upstream side being the side of the gate which comprises fingers; indeed, they cannot flow between the fingers of the gate because of the presence of the insulating regions, nor under these fingers because of the potential induced under the fingers by these regions; they can only flow toward a photodiode downstream of the storage gate, via the side of the gate which does not comprise any fingers; on this side, the gate is directly adjacent to the superficial p region of the downstream photodiode. Conversely, when it has a high potential applied to it, the gate can receive charges coming from the photodiode situated immediately upstream, through the fingers whose ends are directly adjacent to the photodiode. The upstream side and the downstream side are reversed for the first and the second gate.

The sensor preferably comprises means for applying to the first gates a sequence of potentials allowing the storage and the transfer of charges under the first gates, while at the same time maintaining the potential of the second gates at a fixed value during one charge integration cycle, preventing the storage and the transfer of charges under the latter, and means for reversing the roles of the first and second gates, in other words applying a sequence of potentials to the second gates while at the same time maintaining the potential of the first gates at a fixed value.

The sensor can operate according to two main modes.

In a first mode, the gates (and not the photodiodes) are used to store the charges during the integration period. In the case of a transfer of charges in two phases, every other gate in the direction of the columns of pixels (which is the direction of transfer of the charges) is then held at a high potential during one integration half-period, the other gate being held at a low potential; then the roles are reversed during a second integration half-period. However, only the gates having their narrow fingers turned toward the upstream direction are subjected to this sequence. Those that have their narrow fingers turned toward the downstream direction remain at a low potential preventing them from receiving charges or allowing them to pass.

In a second embodiment, it is the photodiodes that are used to store the charges during the integration period; the gates are held at a low potential during the integration period and cannot store charges or allow them to pass. The charges stored in the photodiodes are transferred by a short positive pulse applied to certain rows of gates at the end of each integration half-period (in the case of a transfer of charges in two phases). This pulse is applied to every other gate in the direction of the columns (direction of transfer of the charges) and the role of the gates is reversed at each integration half-period. Here again, only the gates having their narrow fingers turned toward the upstream direction receive this sequence of potentials. Those that have their narrow fingers turned toward the downstream direction remain at a low potential preventing them from receiving charges or allowing them to pass.

The two asymmetric gates are preferably placed side by side in the direction of the rows in such a manner that the photodiodes extend over the whole length of the two gates in this direction.

The second gate may be divided into two parts placed geometrically on either side of the first gate and electrically connected together so as to be controlled simultaneously.

Alternatively, it may be provided for each of the two gates to be divided into at least two parts alternating with the parts of the other gate, each part comprising at least one narrow finger and the parts of the same gate being electrically connected together.

Preferably, the surface area of a photodiode of a row of photodiodes adjacent to a row of gates is greater than the surface area of the two gates of this row which are adjacent to the photodiode. In this case, the photodiodes store the charges during the integration periods and the storage under the gates only takes place during short transfer pulses applied to the gates.

The sensor can preferably comprise a respective rectangular microlens (or two or several square microlenses) centered on each of the photodiodes and directing toward the photodiode the light received on top of a part of the gates adjacent to the photodiode.

The image sensor is a time-delay charge integration multilinear sensor (TDI sensor) with a view to a successive observation of the same image line by several rows of pixels with a summing of the electrical charges generated by an image dot in the pixels of same rank of the various rows, the charges generated by the illumination of a pixel of rank i during one integration period being added to the charges received from the pixel of preceding or following rank at the start of this period.

BRIEF DESCRIPTION OF THE DRAWINGS

Other features and advantages of the invention will become apparent upon reading the detailed description that follows and which is presented with reference to the appended drawings, in which.

DETAILED DESCRIPTION

Figure 1:
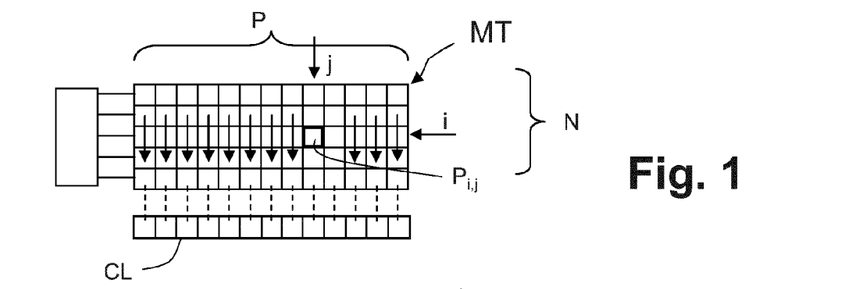
FIG. 1 shows the general structure of a matrix image sensor using charge transfer.

In FIG. 1, the general architecture of an image sensor using charge transfer can be seen. The sensor comprises a matrix MT of N rows of P pixels sensitive to light. The charges resulting from the illumination of a pixel $P_{i,j}$ of rank i in a row and j in a column are integrated in the pixel during an integration period $T_{int}$; then they are transferred into the pixel of the next row of rank i+1 in a row and of same rank j in a column; the adjacent pixels in the direction of the columns (vertical direction in the figure) are arranged as a vertical shift register with charge transfer.

The sensor can be a matrix sensor supplying successive images of N×P image dots or a multilinear TDI sensor supplying linear images of P dots, seen and accumulated by the N rows of pixels.

In the two cases, the pixels in a column behave as vertical shift registers, but it is in the second case only that, on the one hand, the charges photogenerated in this pixel during an integration period $T_{int}$ and, on the other hand, the charges coming from a preceding pixel are accumulated within each pixel.

If the sensor is a time-delay charge integration linear sensor, the charges contained in the N×P pixels are not read after each integration period $T_{int}$, but the charges read by the N pixels of a column during N successive integration periods are accumulated, in synchronism with the progressive passage of the image in front of the sensor. Each of the N rows of pixels successively sees the same image line in the course of the progressive passage of the image with respect to the sensor; the charges integrated in a row of rank i, which correspond to an image line being observed, are added in the pixels of this row to the charges previously read by the i−1 preceding rows which have seen the same image line during the previous integration periods. At the end of N integration periods, the last row of pixels contains the sum of the charges collected by all the rows that have seen the same image line. This row is read at the end of each period $T_{int}$ by a read circuit CL comprising sampling circuits at the foot of each column, followed by one or more analog-digital conversion circuit(s) (using CMOS technology).

Figure 2:
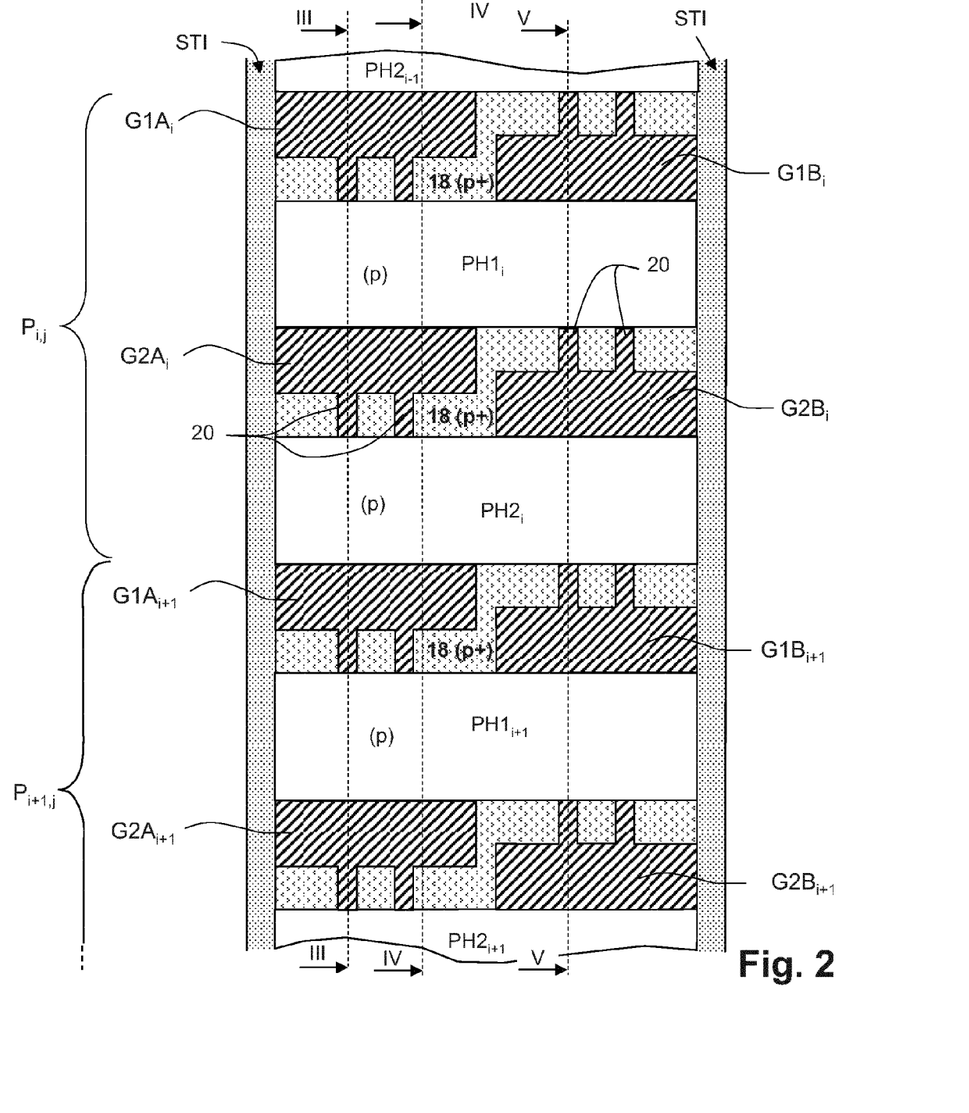
FIG. 2 shows as a top view the composition according to the invention of a column of pixels, in the form of an alternation of gates and photodiodes adjacent to the gates.

The top view in FIG. 2 shows the structure of a column of pixels according to the invention. Two adjacent pixels $P_{i,j}$ and $P_{i+1,j}$ are shown. In a configuration with a transfer of charges in two phases, each pixel comprises two photodiodes, gates situated between the two photodiodes and adjacent to the two photodiodes, and gates situated between one photodiode and the photodiode nearest to the preceding or following pixel, these gates being adjacent to these two photodiodes.

The transfer of charges could also be carried out in three or even four phases, and in this case there would respectively be three or four photodiodes per pixel: for each phase, one photodiode and gates adjacent to one side of this photodiode.

The invention will be described more precisely in the case of a transfer in two phases, the principle being the same for a transfer in three or four phases.

In the example shown in FIG. 2, it is therefore considered that the pixel $P_{i,j}$ comprises a first photodiode $PH1_i$, a second photodiode $PH2_i$, gates $G2A_i$ and $G2B_i$ situated between the two photodiodes, and gates $G1A_i$ and $G1B_i$ situated between the first photodiode $PH1_i$ of the pixel and the second photodiode $PH2_{i-1}$ of the preceding pixel of rank i−1.

The second photodiode $PH2_i$ is furthermore adjacent to two gates $G1A_{i+1}$ and $G1B_{i+1}$ which form part of the next pixel and which are also adjacent to the first photodiode $PH1_{i+1}$ of this next pixel. Lastly, for the pixel $P_{i+1,j}$ there is another photodiode $PH2_{i+1}$ and gates $G2A_{i+1}$ and $G2B_{i+1}$ adjacent to both the photodiode $PH1_{i+1}$ and to the photodiode $PH2_{i+1}$.

The matrix of pixels is thus composed of an alternation of rows of photodiodes and of rows of gates situated between two rows of photodiodes. The gates are adjacent to the photodiodes of the two rows; in the same row of gates there are, for each photodiode, two separate gates (for example $G1A_i$, and $G1B_i$) controlled independently of each other. If the row comprises P pixels, there are 2P gates in each row of gates.

As can be seen in the top view in FIG. 2, the shape of the gate is asymmetric. Considering for example the gate $G2B_i$, one side of the gate is adjacent along its whole length to a first photodiode ($PH1_i$). The other side is adjacent to a second photodiode ($PH2_i$) but only by the end narrow gate fingers 20 extending toward the second photodiode. The rest of the gate is separated from the second photodiode by a semiconductor region 18, highly doped of the p type (the strong doping being symbolized by the nomenclature p+).

Here, the expression "narrow finger" means that the width of the fingers is sufficiently small for the potential within the semiconductor under these fingers to be influenced by the potential of the region 18 and not only by the potential applied to the gate. The potential under the gate outside of the narrow fingers is not influenced by the potential of the region 18 but it is defined only by the potential applied to the gate.

According to the invention, one of the two gates situated between a first photodiode (for example $PH1_i$) and a second photodiode (for example $PH2_i$) has narrow fingers turned toward the first photodiode, but the other gate has narrow fingers turned toward the second photodiode. Here, $G2B_i$ has its narrow fingers turned toward the first photodiode, and $G2A_i$ has its fingers turned toward the second photodiode.

The operation is as follows: if it is desired to transfer the charges from the top of the figure toward the bottom of the figure, hence from the first diodes $PH1_i$ or $PH1_{i+1}$ toward the second diodes $PH2_i$, $PH2_{i+1}$, all the left-hand gates ($G1A_i$, $G2A_i$, $G1A_{i+1}$, $G2A_{i+1}$) are disabled by maintaining their potential at a low value, and the right-hand gates are enabled according to a sequence allowing a transfer of charges. This sequence consists in alternating the potentials of the gates between a low value (low potential 0 volt of the power supply) and a high value (high potential Vdd of the power supply). This sequence will be more precisely described hereinbelow.

All the gates G1B are connected together in order to alternately receive this low potential and this high potential at the end of a first integration half-period. Similarly, all the gates G2B are connected together in order to receive a transfer pulse at the end of a second integration half-period.

In order to transfer the charges in the other direction, an alternation of potentials on the left-hand gates (GA) is used and the right-hand gates (GB) are neutralized by maintaining their potential at a low value. The gates G1A are connected together, but independent of the gates G1B. Similarly, the gates G2A are connected together but independent of the gates G2B.

The transfer of charges therefore takes place from an upstream direction toward a downstream direction through the gates which have their fingers turned in the upstream orientation. If a given direction of transfer is chosen, the gates which have their fingers turned in the upstream orientation must therefore be used and those which have their fingers turned in the downstream orientation neutralized.

Figure 3:
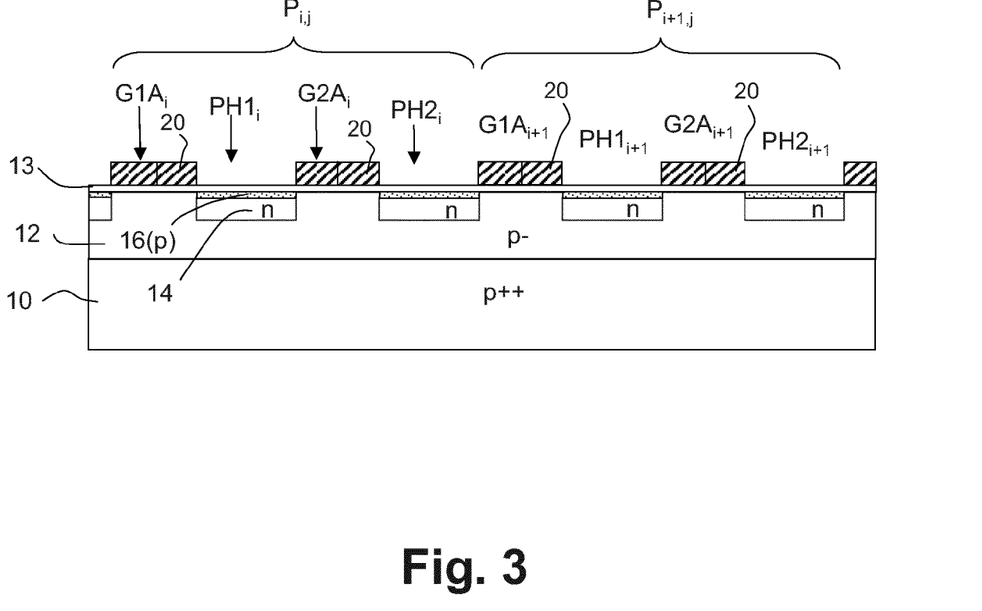
FIGS. 3 and 4 show vertical cross sections along the lines III-III and IV-IV in FIG. 2.
Figure 4:
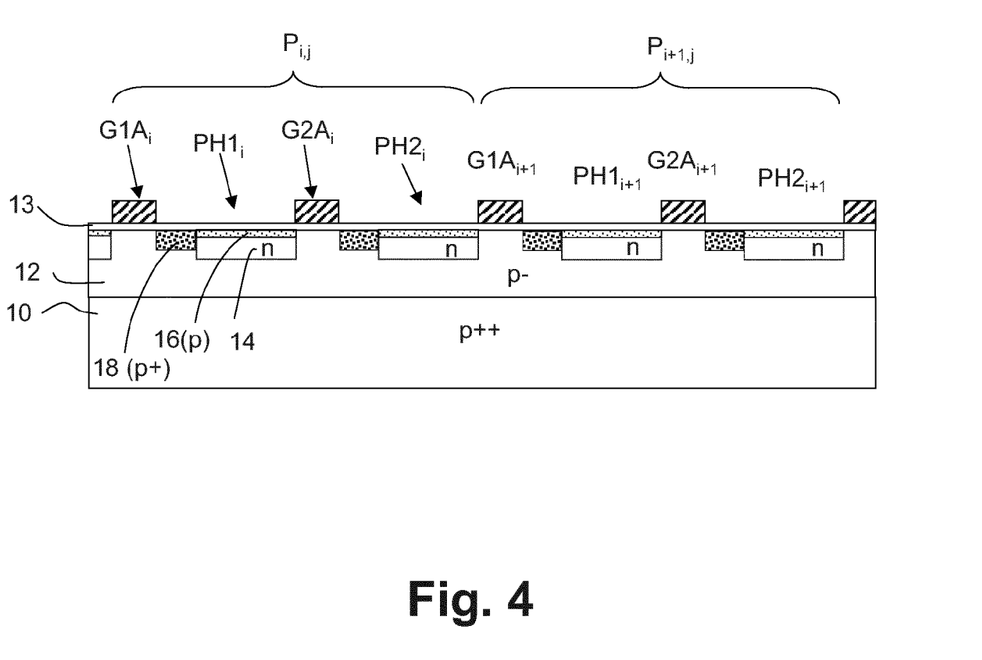

FIG. 3 and FIG. 4 show cross-sectional views of the structure of the sensor. The view in FIG. 3 is a cross section along the line III-III in FIG. 2, through the narrow fingers 20. The view in FIG. 4 is a cross section along the line IV-IV in FIG. 2, where there are no fingers but a p+ region 18 between the gate and a photodiode.

The pixels are formed in a semiconductor substrate 10 whose upper part is an active, lightly-doped, epitaxial semiconductor layer 12. In this example, the substrate is of the highly doped p++ type, and the active epitaxial layer is of the p− type. If the epitaxial layer were of the n type, it would be necessary to invert all the types of conductivity, together with the signs of the potentials applied to the photodiodes and to the gates. The substrate is in principle of the same type of conductivity as the epitaxial layer, but it could also be of the opposite type.

The gates are polycrystalline silicon gates, insulated from the epitaxial layer 12 by a thin insulating layer 13 (silicon oxide or nitride). The photodiodes are photodiodes of the "pinned" type, in other words they are formed by a multilayer comprising: the epitaxial layer 12 of the p type (common active layer for all the photodiodes of all the pixels), an individual region 14 of the n type diffused into the epitaxial layer between two transfer gates, and a superficial individual region 16 of the p type, more doped than the epitaxial layer, covering the individual region 14 and held at a fixed potential. The electrons generated by the illumination will be able to accumulate in potential wells formed at the junction between the n region and the epitaxial p layer.

The regions 18, doped of the P+ type, only visible in FIG. 4, are more doped than the superficial regions 16. They have a reference low potential applied to them which is the potential of the active layer 12. They are adjacent to the superficial regions and bring the potential of the superficial regions to this potential.

If the superficial regions 16 are very shallow, as is desired in order to improve the sensitivity in the blue, then the regions 18 are preferably deeper than the regions 16.

The pixel columns are separated by insulation regions STI (oxide of silicon or other insulator) which prevent any transfer of charges between pixels of different columns.

Figure 5:
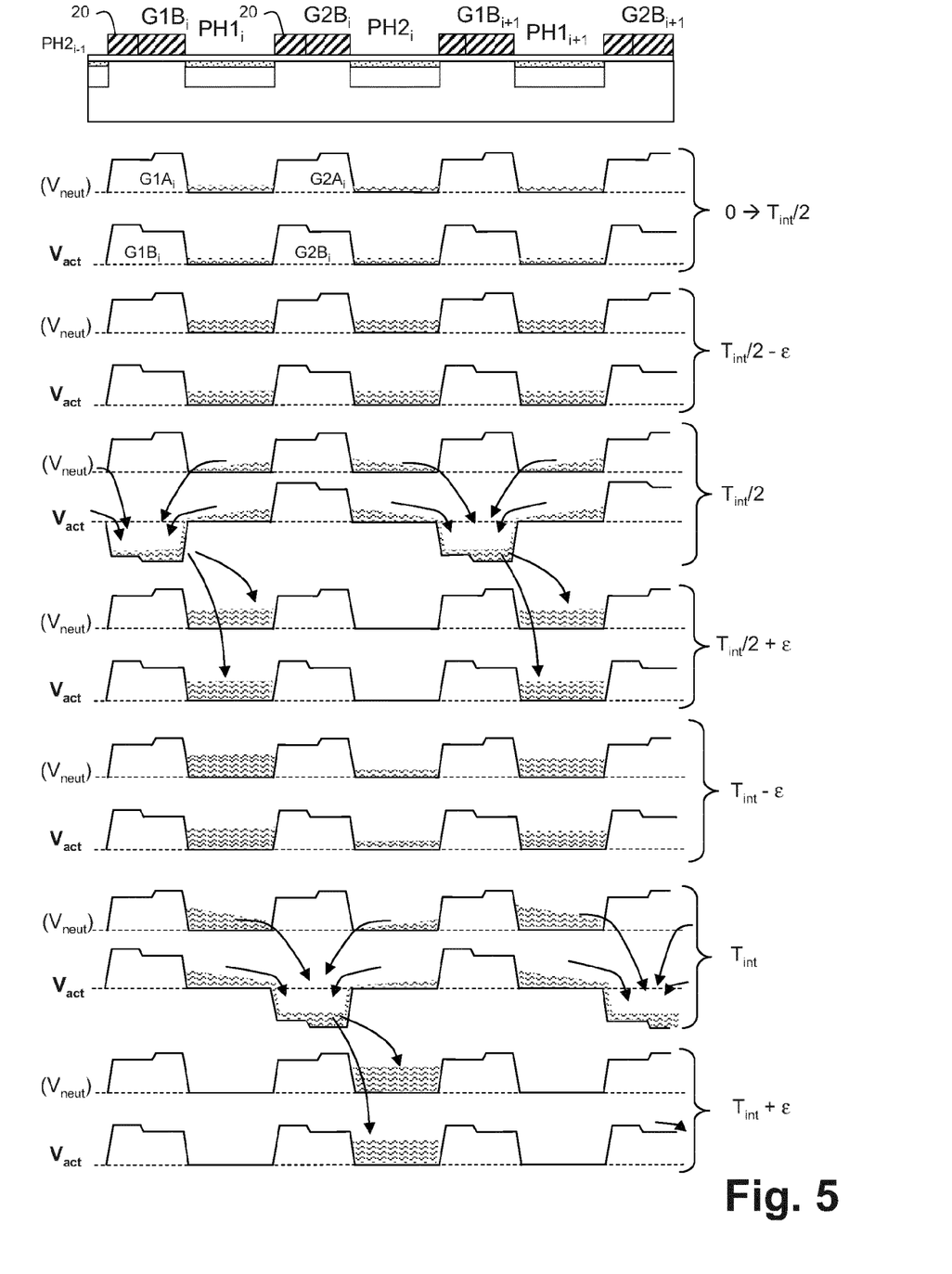
FIG. 5 shows a diagram of successive potentials in the semiconductor.

FIG. 5 shows a diagram of potentials inside of the active layer, at a depth where the storage and the transfer of charges is located, in other words slightly underneath the top surface of the active layer.

The potentials are shown during the various phases of operation and take into account the fact that the potential under the narrow fingers, for a given potential applied to the gate, is not the same as the potential under the rest of the gate owing effectively to the narrowness of the finger. More precisely, for a given potential applied to the gate, and hence also applied to the narrow fingers of the gate, the influence exerted by the low potential of the p+ regions 18 that surround the narrow finger tends to decrease the potential in the semiconductor under the narrow fingers with respect to the potential in the semiconductor under the rest of the gate, without however reducing it as much as in the p+ regions. According to the usual convention, increasing potentials are directed downward in order to make the potential wells and the potential barriers for the electrons clearly apparent.

The potential diagrams shown correspond to the variations in potential along the cross-sectional line V-V in FIG. 2, the cross section V-V being shown above these diagrams in order to facilitate the comprehension.

Two modes of operation are possible:
a mode in which the charges accumulate under the gates during the integration periods; in this case, a high potential is applied to every other gate in the direction of the columns (direction of transfer of the charges) during a first integration half-period, this high potential creating a potential well under the gate in question; the other gates receive a low potential; at the end of the first integration half-period, the roles of the gates are reversed: those that had a high potential receive a low potential and vice versa. Only the gates having their narrow fingers oriented upstream are concerned by this sequence. The others receive a fixed low potential and can neither receive charges nor allow charges to pass;
a mode in which the charges accumulate in the photodiodes rather than under the gates during the integration periods; the gates only store charges temporarily during a brief transfer operation.

FIG. 5 corresponds to the second mode, and it corresponds to an operation in two phases, which means that each pixel with an approximately square shape comprises two photodiodes, and that the integration period is decomposed into two integration half-periods with a partial transfer of charges after each half-period. It is recalled that the sensor could operate in three or four phases with pixels having an approximately square shape comprising three or four photodiodes.

FIG. 5 corresponds to a transfer of charges from top to bottom in FIG. 2, in other words the right-hand gates G1B, G2B are actively used to carry out the transfers through these gates and the left-hand gates G1A, G2A are neutralized.

For each step of the diagram, the potentials of the active channel $V_{act}$ are shown, but also the potentials of the neutralized channel $V_{neut}$ (which do not vary with time but which play a role in prohibiting the passage of charges under the neutralized gates).

All the neutralized gates G1A, G2A remain at a low potential during all the integration and charge transfer cycles. No storage or transfer of charges can take place under these gates.

The potential of the semiconductor in the photodiodes, assumed to be devoid of charges, has a value fixed by the fact that the superficial layer of the p type is held at the reference potential of the active layer. This basic potential of the empty photodiode is represented by a dashed line; it depends on the doping profiles of the regions 12, 14, 16 in the photodiode.

The potentials vary over one integration period $T_{int}$ decomposed into two phases of duration $T_{int}/2$.

The first group of two rows of the diagram in FIG. 5 represents the internal potentials of the active layer during a first integration half-period going from an initial time 0 to a time $T_{int}/2$. All the gates G1B, G2B are at a low potential (as are the gates G1A, G2A) and the charges accumulate progressively under the effect of the light in the potential wells formed under all the photodiodes. These wells are closed by the low potentials applied to the active gates and to the neutralized gates. They are also closed by the p+ regions 18 which form a potential barrier even higher than the barrier formed under the gates. Lastly, they are also closed by the insulation regions STI which separate the columns of pixels from one another.

The second group of rows of the diagram represents the internal potentials at a time $T_{int}/2-\epsilon$, in other words just prior to the end of the first integration half-period $T_{int}/2$. The photodiodes have acquired all the charges generated by the illumination during this period of time.

The third group of rows represents the moment of application of a short transfer pulse to every other active gate. Here, the gates G1B (G1B$_i$, G1B$_{i+1}$, etc.) all receive this transfer pulse but not the gates G2B (G2B$_i$, G2B$_{i+1}$).

The transfer pulse is at a high potential creating a potential well under the gates that receive it. The charges accumulated in the photodiodes get stored under the gates that are adjacent to them. This means that the gate G1B$_i$ receives the charges from the photodiode PH1$_i$ but also (through its narrow fingers) the charges from the photodiode PH2$_{i-1}$ of the pixel situated immediately upstream. Similarly, the gate G1B$_{i+1}$ receives the charges from the photodiode PH2$_i$ and the charges from the photodiode PH1$_{i+1}$ of the pixel situated immediately downstream.

The fourth group of rows represents the state of the potentials at the time $T_{int}+\epsilon$, in other words immediately after the end of the short transfer pulse. The potential under the gates G1B goes back down to its starting low level. The charges stored under the gates G1B are discharged into the adjacent photodiode on the downstream side. They do not go toward the upstream photodiode because they would only be able to pass under the narrow fingers (the p+ regions 18 forming a barrier), but the potential under the narrow fingers is lower than the rest of the potential under the gate and the charges are naturally oriented in the downstream direction. Only the photodiodes PH1 (PH1$_i$, PH1$_{i+1}$) therefore receive charges, the photodiodes PH2 remaining devoid of charges.

The fifth group of rows represents the end of the second integration half-period, at a time $T_{int}-\epsilon$ immediately preceding a new transfer pulse. The photodiode PH2$_i$ has been filled with charges resulting from the illumination of this photodiode during the second integration half-period, but the photodiode PH1$_i$ is filled at the same time with the charges resulting from the illumination of the pixel during this half-period and with the charges transferred during the preceding transfer pulse originating from the photodiodes PH1$_i$ and PH2$_{i-1}$.

The sixth group of rows represents the state of the potentials during a second short transfer pulse at the time $T_{int}$. The potential of the gates G2B is raised to the high level in order to create potential wells under these gates. The potential of the gates G1B does not change. The charges from the photodiodes PH1$_i$ and PH2$_i$ adjacent to the gate G2B$_i$ move under the gate G2B$_i$.

Finally, the seventh group of rows represents the final state of the potentials at the time $T_{int}+\epsilon$, at the end of the short transfer pulse. The potential of the gates G2B is brought back down to the low state. The charges go back into the photodiodes but in a unilateral fashion in the direction from upstream toward downstream owing to the potential barrier being higher under the narrow fingers and lower under the rest of the gate. The photodiodes PH2 are filled with the charges temporarily stored under the gate G2B. The photodiodes PH1 remain devoid of charges.

This final state constitutes the initial state of a new integration period. The charges contained in the photodiodes PH2$_i$ are the sum of the charges previously contained (at the time 0) in the photodiode PH2$_{i-1}$, the charges generated by the photodiodes PH2$_{i-1}$ and PH1$_i$ in the first integration half-period, and the charges generated by the photodiodes PH1$_i$ and PH2$_i$ during the second integration half-period. The photodiodes PH1 (PH1$_i$ and PH1$_{i+1}$) are devoid of charges in this initial state.

The overall direction of transfer of the charges goes from left to right, in other words the charges accumulated in the second photodiode PH2$_{i-1}$ of an upstream pixel at the start of an integration period $T_{int}$ find themselves in the second photodiode PH2$_i$ of the next pixel at the start of the following integration period with charges generated during the period $T_{int}$. There has accordingly been both a unidirectional transfer of the charges to the right, and a summing of the charges accumulated in a preceding pixel with the charges generated in the current pixel, all of which gives an operation of the TDI type.

By reversing the roles of the gates GA and GB and by conserving the same chronology of signals, the direction of transfer is reversed.

The simulations performed show that the height of the potential barrier BP1$_i$, BP2$_i$, strongly varies with the width of the narrow fingers 20; typically, it can vary from 0.5 volts to 2.5 volts for widths of fingers varying from 0.7 micrometers to 0.1 micrometers; these values are purely indicative because they depend on the etch technology and on the levels of implantation used. A width of fingers less than or equal to 0.4 micrometers is a good choice. The length of the fingers in the direction of the transfer can be around 0.4 micrometers.

It will be noted that the ends of the fingers of the same gate could be connected together by a narrow strip of gate.

The charges are discharged at the end of a column preferably into a series of charge storage nodes and of charge-voltage conversion circuits (one charge storage node and one charge-voltage conversion circuit being associated with each column of the matrix). The conversion circuit comprises a few transistors, analogous to the transistors of a sensor active pixel using CMOS technology, amongst which are a follower transistor and a reset transistor. The conversion circuit is then preferably associated with a correlated double sampling circuit which firstly samples a reset potential level at the moment of the reset of the potential of the charge storage node, then a level of useful signal after discharging of charges from the last row of the matrix into the charge storage nodes. The difference of the two samples is converted by an analog-digital converter. An elementary converter may be provided for each column of pixels or else a global converter performs the conversion for each of the columns sequentially.

Figure 6:
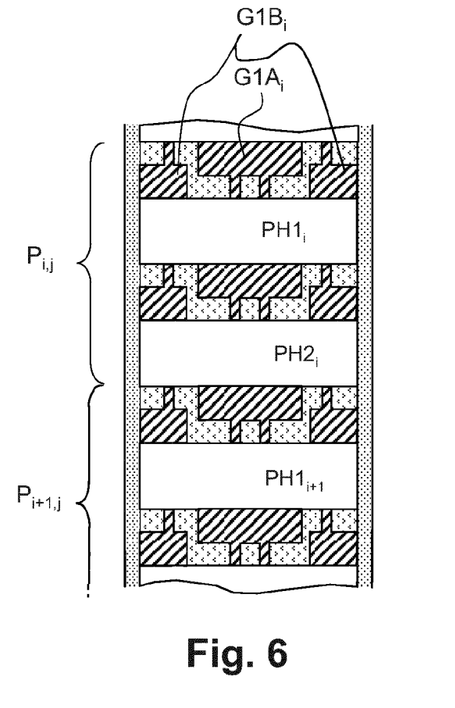
FIG. 6 and FIG. 7 show variant embodiments of the gates.

FIG. 6 shows one variant embodiment of the gates: of the two gates associated with a pixel and forming part of the same row of gates, it is provided for one of the gates (G1B) to be divided into two parts electrically connected together by a conductor not shown, and these two parts are disposed on either side of the other gate (G1A).

Figure 7:
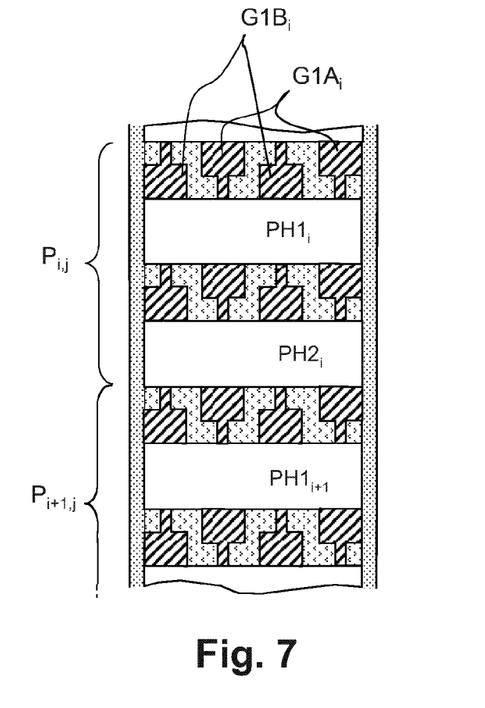

FIG. 7 shows another variant in which the two gates G1A and G1B are divided into at least two parts and the parts of one of the gates are geometrically alternated with the parts of the other gate. Each part comprises at least one narrow finger, turned toward one or the other photodiode depending on whether it is part of a gate GA or part of a gate GB.

Whatever the make-up of the gates, there exists a risk of deterioration of the geometrical modulation transfer function owing to the fact that an electron generated in the semiconductor under the gates (the gates are transparent) is going to be naturally directed toward one or the other of the photodiodes adjacent to the gate. Depending on whether this capture occurs during one or the other of the integration half-periods, this has or doesn't have a negative consequence on the MTF.

Thus, for example:
an electron generated under the gate G2B$_i$ during the second integration half-period, is normally directed toward the photodiode PH$i_2$; during the transfer pulse that follows, it is directed toward the gate G2B$_i$ then toward the photodiode PH2$_i$;
an electron generated at the same moment under the gate G2A$_i$ is normally directed toward the photodiode PH1$_i$;

during the transfer pulse that follows, it is also directed toward the gate G2B$_i$ then toward the photodiode PH2$_j$.

In this case, there is no difference in the treatment of the electron depending on whether it is generated under the gate G2A$_i$ or the gate G2B$_i$ and this is advantageous.

However:

an electron generated under the gate G2B$_i$ during the first integration half-period is normally directed toward the photodiode PHi$_2$; during the transfer pulse that follows, it is directed toward the gate G1B$_{i+1}$ then toward the photodiode PH1$_{i+1}$;

conversely, an electron generated at the same moment under the gate G2A$_i$ is normally directed toward the photodiode PH1$_i$; during the transfer pulse that follows, it goes backward toward the gate G1B$_i$ then toward the photodiode PH1$_i$.

There is therefore a divergence in treatment depending on whether the electron is generated under the gate G2B$_i$ or under the gate G2A$_i$; this divergence is detrimental to the modulation transfer function by mixing the electrons coming from one pixel with those from another.

In order to avoid this deterioration, the solution provided is to cover each half-pixel with a focusing microlens which concentrates the light received on top of the surface of a half-pixel onto the photodiode. Thus, the electrons will be systematically generated in the photodiode and not under the gates.

Figure 8:
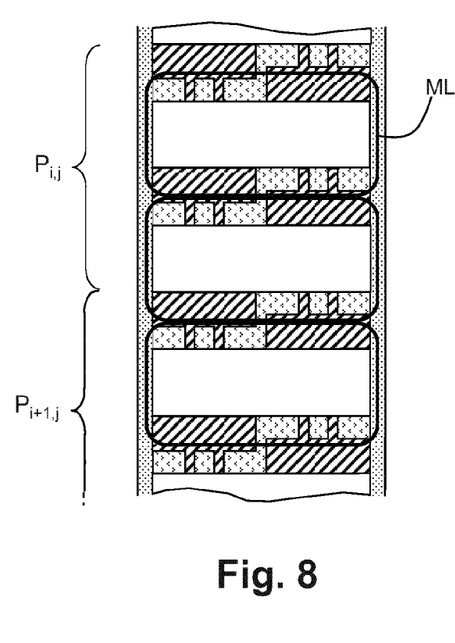
FIG. 8 and FIG. 9 show the column of pixels with microlenses disposed above each photodiode.

In the embodiment in FIG. 8, the microlens ML has a rectangular shape and is centered on the photodiode. It covers the whole photodiode together with half of the surface area of the gates situated on either side of the photodiode. Two adjacent microlenses, covering two respective half-pixels, cover an approximately square shape corresponding to a whole pixel.

Figure 9:
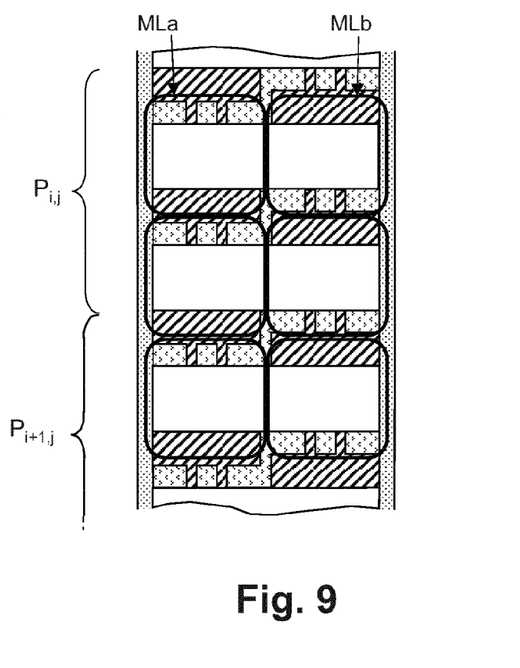

In the embodiment in FIG. 9, the solution is to provide two adjacent square microlenses in a row MLa and MLb instead of the rectangular microlens. Each microlens is centered on half of a photodiode and covers this half of photodiode and half of the gates adjacent to this half of photodiode. Four adjacent square microlenses cover an approximately square surface area corresponding to a whole pixel.

The invention claimed is:

1. An image sensor using charge transfer, the sensor comprising rows of photodiodes alternating with rows of gates adjacent to the photodiodes, the gates covering a semiconductor active layer region of a first type of conductivity and the photodiodes being formed in the semiconductor active layer by individual regions of a second type of conductivity, themselves covered by individual superficial regions of the first type, connected to a reference potential for the semiconductor active layer, wherein the image sensor comprises at least two independent gates exhibiting an asymmetry between an upstream side and a downstream side, each independent gate being adjacent on one side to a photodiode and having, on another side, narrow gate fingers extending toward another photodiode, the narrow fingers being separated from one another by insulating regions doped with the first type of conductivity, more doped than said individual superficial regions and also connected to the reference potential of the active layer, a first gate among the two independent gates having its narrow fingers extending toward a first photodiode belonging to a first row of photodiodes and a second gate among the two independent gates having its narrow fingers extending toward a second photodiode belonging to a second row of photodiodes, and the two independent gates being controllable separately from each other.

2. The sensor as claimed in claim 1, wherein the two asymmetric gates are placed side by side in the direction of the rows.

3. The image sensor as claimed in claim 1, configured to operate as a time-delay charge integration sensor, with a successive observation of the same image line by several rows of pixels with a summing of the electrical charges generated by an image dot in the pixels of same rank of the various rows, the charges generated by the illumination of a pixel of rank i during one integration period being added to the charges received from the pixel of preceding or following rank at the start of this period.

4. The sensor as claimed in claim 1, further comprising circuitry configured for applying to the first gates a sequence of potentials allowing the storage and the transfer of charges under the first gates, while at the same time maintaining the potential of the second gates at a fixed value during one charge integration cycle, preventing the storage and the transfer of charges under the second gates, and means for reversing the roles of the first and second gates, in other words applying a sequence of potentials to the second gates while at the same time maintaining the potential of the first gates at a fixed value.

5. The sensor as claimed in claim 4, wherein the sequence of potentials applied to a first or a second gate comprises the application of a potential prohibiting the storage of charges under the gate during a first integration period ($T_{int}/2$), then the application of a short pulse to certain rows of gates creating under these gates a potential well allowing the discharge of charges from the photodiodes adjacent to the gate as far as under the gate.

6. The sensor as claimed in claim 1, wherein the second gate is divided into two parts placed geometrically on either side of the first gate and electrically connected together so as to be controlled simultaneously.

7. The sensor as claimed in claim 6, wherein each of the two gates is divided into at least two parts alternating with the parts of the other gate, the parts of a gate being electrically connected together, each part comprising at least one narrow finger.

8. The image sensor as claimed in claim 1, further comprising a respective rectangular microlens centered on each of the photodiodes and directing toward the photodiode the light received on top of a part of the gates adjacent to the photodiode.

9. The image sensor as claimed in claim 1, further comprising, on top of each photodiode, at least two juxtaposed square microlenses forming an assembly centered above the photodiode and directing toward the photodiode the light received on top of the photodiode and on top of a part of the gates adjacent to the photodiode.

* * * * *